US 9,236,022 B2

(12) United States Patent
Gu et al.

(10) Patent No.: US 9,236,022 B2
(45) Date of Patent: Jan. 12, 2016

(54) GATE DRIVING CIRCUIT, SWITCHING CONTROL CIRCUIT AND SHIFT REGISTER OF DISPLAY DEVICE (71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiaofang Gu, Beijing (CN); Rui Ma, Beijing (CN); Ming Hu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 180 days.

(21) Appl. No.: 14/098,005

(22) Filed: Dec. 5, 2013

(65) Prior Publication Data

US 2014/0159999 A1  Jun. 12, 2014

(30) Foreign Application Priority Data

Dec. 7, 2012  (CN) .......................... 2012 1 0525327

(51) Int. Cl.
G09G 3/36  (2006.01)
G11C 19/28  (2006.01)

(52) U.S. Cl.
CPC .............. G09G 3/3677 (2013.01); G11C 19/28 (2013.01); G09G 2310/0283 (2013.01); G09G 2310/0286 (2013.01); G09G 2310/06 (2013.01)

(58) Field of Classification Search
CPC .............. G09G 3/3674; G09G 3/3688; G09G 2310/0286
See application file for complete search history.

(56) References Cited

U.S. PATENT DOCUMENTS

| 2004/0100304 | A1* | 5/2004 | Kawase et al. ................. 326/86 |
| 2008/0012809 | A1* | 1/2008 | Kim et al. ........................ 345/87 |
| 2008/0018572 | A1* | 1/2008 | Shin et al. ....................... 345/87 |
| 2009/0115792 | A1  | 5/2009 | Otose et al. |
| 2011/0002438 | A1* | 1/2011 | Kim ................................. 377/67 |
| 2011/0148852 | A1* | 6/2011 | Kim ............................... 345/213 |

FOREIGN PATENT DOCUMENTS

| CN | 101625495 A | 1/2010 |
| CN | 102750987 A | 10/2012 |
| JP | 2010073301 A | 4/2010 |

OTHER PUBLICATIONS

Chinese Office Action regarding Application No. 201210525327.1, dated Sep. 22, 2014. Translation provided by Dragon Intellectual Property Law Firm.

(Continued)

Primary Examiner — Ricardo L Osorio (74) Attorney, Agent, or Firm — Harness, Dickey & Pierce, P.L.C.

(57) ABSTRACT

According to one aspect of the present invention, the provided is a gate driving circuit, comprising: a first switch control circuit, being configured to be respectively coupled to each of the multiple stages of shift register units; a second switch control circuit, being configured to be respectively coupled to each of the multiple stages of shift register units. The first switch control circuit controls the multiple stages of shift register units to turn on in a forward sequence; the second switch control circuit controls the multiple stages of shift register units to turn on in a backward sequence.

18 Claims, 6 Drawing Sheets

(56) References Cited

OTHER PUBLICATIONS

Chinese Office Action mailed Mar. 17, 2015 regarding Chinese Application No. 201210525327.1. Translation provided by Dragon Intellectual Property Law Firm.

Office Action from Chinese counterpart application CN201210525327.1 issued by the State Intellectual Property Office of China (SIPO) dated Apr. 2, 2014. English Translation provided by Dragon Intellectual Property Law Firm.

* cited by examiner

Fig. 1

-Prior-Art-

GATE DRIVING CIRCUIT, SWITCHING CONTROL CIRCUIT AND SHIFT REGISTER OF DISPLAY DEVICE

CROSS REFERENCE OF THE RELATED APPLICATIONS

The present application claims priority to and incorporates by reference the entire contents of Chinese priority document 201210525327.1, filed in China on Dec. 07, 2012.

BACKGROUND OF THE INVENTION

1. Field of the Invention

The embodiments of the present invention relate to a driving circuit of a LCD device, and more particularly to a gate driving circuit, a switching control circuit and a shift register of a LCD device.

2. Description of the Prior Art

Liquid Crystal Display (LCD) has been widely used in various display fields, such as family, public places, offices, and personal electronics-related products. A conventional LCD controls the transmittance of the liquid crystal layer to display an image thereon by the electric field. Therefore, the LCD includes a LCD panel and a driving circuit, wherein liquid crystal cells are arranged in a matrix form in the LCD panel.

When the LCD displays, a signal is outputted by the driving circuit and each pixel is scanned line by line. The drive of the LCD mainly includes a gate driver and a data driver. The data driver latches the inputted display data and clock signal on time sequentially, coverts into an analog signal and then inputs into a data line of the LCD panel, while the gate driver converts the inputted clock signal by a shift register (SR) and switches into an ON/OFF voltage, which is then applied to the gate line of the LCD panel sequentially. The shift register in the gate driver is used for generating the scanning signal in the scanning gate line. Furthermore, the scanning direction of the display device corresponds to the orientation of the LCD, and therefore the orientation of the displayed image may be changed by changing the scanning direction. Accordingly, a LCD with a bi-directional scanning is desired for better facilitating the development of the products.

Figure 1:
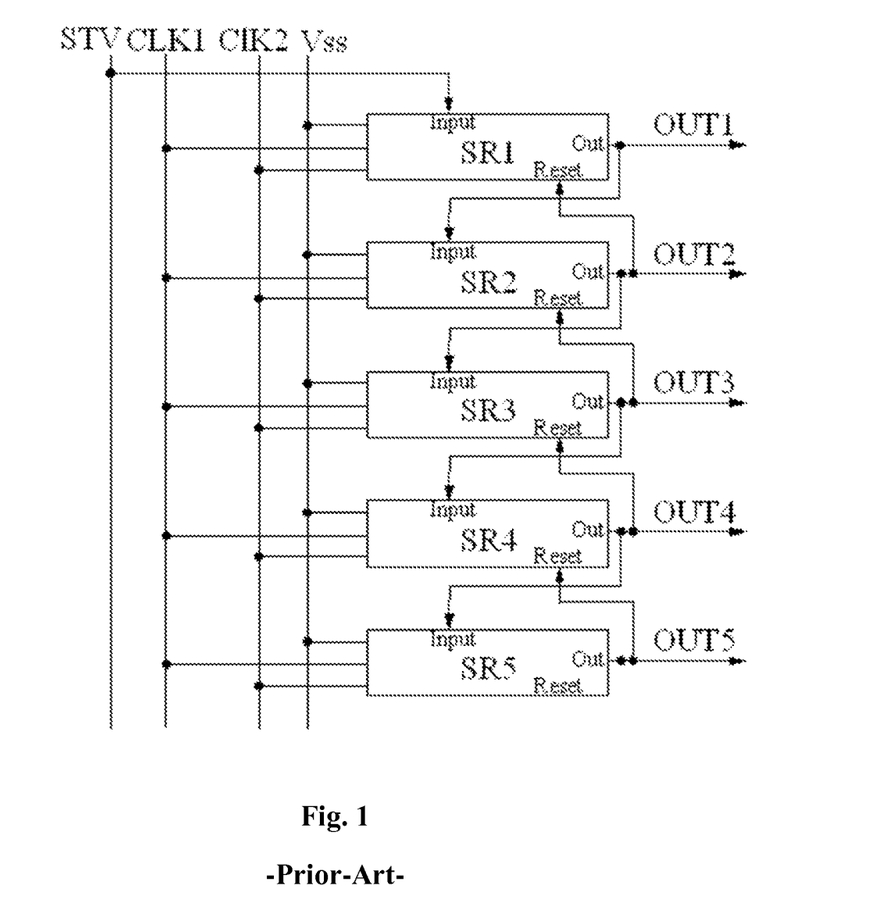
FIG. 1 is a schematic diagram of the gate driving circuit of the conventional LCD device.

FIG. 1 is a schematic diagram of a conventional gate driving circuit, which includes a plurality of shift register SR1-SRn, a ground voltage Vss providing line, a first clock CLK providing line, a second clock CLK providing line, and a turn-on pulse STV providing line. Here, the phase of the first clock signal CLK1 is opposite to the phase of the second clock signal CLK2.

When the conventional gate driving circuit operates, if STV=1, a high level pulse is outputted to the input of the first line, and thus the first line turns on, a gate high level is inputted into the panel, and other lines turn off, while an input is injected for the next line thereof, and thus the second line turns on. When the second line outputs a high level, the first line is reset. At this time, all lines turn off except this line, while an input is injected for the next line thereof. Such process is repeated until the last line. Such a circuit only implements the scanning in a particular direction, which cannot satisfy the requirement of changing the orientation of the displayed image.

SUMMARY OF THE INVENTION

The technical problem to be solved by the present invention lies in providing a gate driving circuit, a switch control circuit and a shift register of a display device and implementing the bi-directional scanning of the gate.

For solving the above technical problem, an embodiment of the present invention provides a gate driving circuit of a display device, comprising:

multiple stages of shift register units, being configured to be sequentially coupled, and each of the multiple stages of shift register units being coupled to a row of gate line;

a first switch control circuit, being configured to be respectively coupled to each of the multiple stages of shift register units, input a pull-up signal to each of the multiple stages of shift register units under the control of a forward signal, and control each of the multiple stages of shift register units to turn on in forward sequence;

a second switch control circuit, being configured to be respectively coupled to each of the multiple stages of shift register units, and input a reset signal to each of the multiple stages of shift register units under the control of a backward signal, and control each of the multiple stages of shift register units to turn on in a backward sequence;

a first thin film transistor (TFT), being configured to input a start signal to the first stage of shift register unit among the multiple stages of shift register units under the control of the forward signal; and a second TFT, being configured to input a start signal to the last stage of shift register unit among the multiple stages of shift register units under the control of the backward signal.

Further, a first input terminal, a second input terminal and a third input terminal of the first switch control circuit are coupled to the first clock providing line, the second clock providing line and the third clock providing line respectively; and a first input terminal, a second input terminal and a third input terminal of the second switch control circuit are coupled to the first clock providing line, the second clock providing line and the third clock providing line respectively.

Further, a fourth input terminal and a fifth input terminal of the first switch control circuit are coupled to the first voltage providing line and the second voltage providing line respectively; and a fourth input terminal and a fifth input terminal of the second switch control circuit are coupled to the first voltage providing line and the second voltage providing line respectively.

Further, a gate of the first TFT switch is coupled to the first voltage providing line, a drain thereof is coupled to an input terminal of the first stage of shift register units, and a source thereof is coupled to the turn on voltage providing line; and a gate of the second TFT switch is coupled to the second voltage providing line, the drain thereof is coupled to an input terminal of the last stage of shift register units, and the source thereof is coupled to the turn on voltage providing line.

Further, an input terminal of each of the multiple stages of shift register units is further coupled to the ground voltage providing line.

Further, each of the first switch control circuit and the second switch control circuit has three output terminals; clock input terminals of the multiple stages of shift register units are sequentially coupled to a first output terminal, a second output terminal and a third output terminal of the first switch control circuit;

reset terminals of the multiple stages of shift register units are sequentially coupled to a first output terminal, a second output terminal and a third output terminal of the second switch control circuit in a forward sequence; and the input terminal of each of the multiple stages of shift register units is also coupled to the first voltage providing line and the second voltage providing line.

Further, the first switch control circuit comprises a first transistor switch, a second transistor switch, a third transistor switch and a fourth transistor switch; wherein, a gate of the first transistor switch of the first switch control circuit is coupled to the fourth input terminal of the first switch control circuit, the source of the first switch control circuit is coupled to the first input terminal of the first switch control circuit, and the drain of the first switch control circuit is coupled to the first output terminal of the first switch control circuit;

a gate of the second transistor switch of the first switch control circuit is coupled to the fourth input terminal of the first switch control circuit, the source of the first switch control circuit is coupled to the third input terminal of the first switch control circuit, and the drain of the first switch control circuit is coupled to the third output terminal of the first switch control circuit;

a gate of the third transistor switch of the first switch control circuit is coupled to a fifth input terminal of the first switch control circuit, the source of the first switch control circuit is coupled to the first input terminal of the first switch control circuit, and the drain of the first switch control circuit is coupled to the third output terminal of the first switch control circuit;

a gate of the fourth transistor switch of the first switch control circuit is coupled to the fifth input terminal of the first switch control circuit, the source of the first switch control circuit is coupled to the third input terminal of the first switch control circuit, and the drain of the first switch control circuit is coupled to the first output terminal of the first switch control circuit; and the second input terminal of the first switch control circuit is directly coupled to the second output terminal of the first switch control circuit.

Further, the second switch control circuit comprises a fifth transistor switch, a sixth transistor switch, a seventh transistor switch and an eighth transistor switch; wherein, a gate of the fifth transistor switch of the second switch control circuit is coupled to the fourth input terminal of the second switch control circuit, the source thereof is coupled to the first input terminal of the second switch control circuit, and the drain thereof is coupled to the third output terminal of the second switch control circuit;

a gate of the sixth transistor switch of the second switch control circuit is coupled to the fourth input terminal of the second switch control circuit, the source thereof is coupled to the second input terminal of the second switch control circuit, and the drain thereof is coupled to the first output terminal of the second switch control circuit;

a gate of the seventh transistor switch of the second switch control circuit is coupled to the fifth input terminal of the second switch control circuit, the source thereof is coupled to the first input terminal of the second switch control circuit, and the drain thereof is coupled to the first output terminal of the second switch control circuit;

a gate of the eighth transistor switch of the second switch control circuit is coupled to the fifth input terminal of the second switch control circuit, the source thereof is coupled to the second input terminal of the second switch control circuit, and the drain thereof is coupled to the third output terminal of the second switch control circuit; and the third input terminal of the second switch control circuit is directly coupled to the second output terminal of the second switch control circuit.

Further, the shift register unit comprises seven transistor switches and a capacitor;

a gate of the first transistor switch of the shift register unit is coupled to the output terminal of the preceding stage shift register unit, a source thereof is coupled to the first voltage providing line, and a drain thereof is coupled to the gate of the seventh transistor switch of the shift register unit;

a gate of the second transistor switch of the shift register unit is coupled to the output terminal of the next stage of shift register unit, a source thereof is coupled to the second voltage providing line, and a drain thereof is coupled to the gate of the seventh transistor switch of the shift register unit;

a gate and a source of the third transistor switch of the shift register unit are coupled to the reset terminal of the shift register unit, and a drain thereof is coupled to the gate of the sixth transistor switch of the shift register unit;

a gate of the fourth transistor switch of the shift register unit is coupled to the gate of the seventh transistor switch of the shift register unit, a source thereof is coupled to the ground voltage providing line, and a drain thereof is coupled to the gate of the sixth transistor switch of the shift register unit;

a gate of the fifth transistor switch of the shift register unit is coupled to the gate of the sixth transistor switch of the shift register unit, a source thereof being as its sixth input terminal of the shift register unit is coupled to the ground voltage providing line, and a drain thereof is coupled to the gate of the seventh transistor switch of the shift register unit;

a source of the sixth transistor switch of the shift register unit is coupled to the ground voltage providing line, and a drain thereof is coupled to the output terminal of the shift register unit;

a source of the seventh transistor switch of the shift register unit being as a seventh input terminal of the shift register unit is coupled to the clock input terminal of the shift register unit, and a drain thereof is coupled to the output terminal of the shift register unit;

A terminal of the capacitor C is coupled to the gate of the seventh transistor, and the other terminal thereof is coupled to the output terminal OUT;

wherein, the gate of the first transistor switch of the first stage of shift register units is coupled to the drain of the first TFT, and the gate of the second transistor switch is coupled to the output terminal of the next stage of shift register unit;

the gate of the second transistor switch of the last stage of shift register units is coupled to the drain of the second TFT, and the gate of the first transistor switch is coupled to the output terminal of the preceding stage of shift register unit.

Further, when the signal of the first voltage providing line is at a high level and the signal of the second voltage providing line is at a low level, the output terminals of the first switch control circuit and the second switch control circuit output clock signals of the first clock providing line, the second clock providing line and the third clock providing line respectively, which are inputted into the multiple stages of shift register units to implement forward scanning of multiple rows of gate lines under the control of the first TFT and the second TFT; or when the signal of the first voltage providing line is a low level and the signal of the second voltage providing line is at a high level, the output terminals of the first switch control circuit and the second switch control circuit output the clock signals of the first clock providing line, the second clock providing line and the third clock providing line respectively, which are inputted into the multiple stages of shift register units to implement backward scanning of multiple rows of gate lines under the control of the first TFT and the second TFT.

The embodiment of the present invention also provides a switch control circuit, comprising a first transistor switch, a second transistor switch, a third transistor switch and a fourth transistor switch; wherein a gate of the first transistor switch is coupled to an input terminal of a first voltage providing line, a source thereof is coupled to a first input terminal of the switch control circuit; a gate of the second transistor switch is coupled to the input terminal of the first voltage providing line; a gate of the third transistor switch is coupled to an input terminal of a second voltage providing line, a source thereof is coupled to the first input terminal of the switch control circuit; and a gate of the fourth transistor switch is coupled to the input terminal of the second voltage providing line.

The embodiment of the present invention also provides a switch control circuit, wherein a gate of a first transistor switch is coupled to an input terminal of a first voltage providing line, a source thereof is coupled to a first input terminal of the switch control circuit, and a drain thereof is coupled to a first output terminal of the switch control circuit;

a gate of a second transistor switch is coupled to the input terminal of the first voltage providing line, a source thereof is coupled to a third input terminal of the switch control circuit, and a drain thereof is coupled to a third output terminal of the switch control circuit;

a gate of a third transistor switch is coupled to an input terminal of a second voltage providing line, a source thereof is coupled to the first input terminal of the switch control circuit, and a drain thereof is coupled to the third output terminal of the switch control circuit;

a gate of a fourth transistor switch is coupled to the input terminal of the second voltage providing line, a source thereof is coupled to the third input terminal of the switch control circuit, and a drain thereof is coupled to the first output terminal of the switch control circuit; and the second input terminal of the switch control circuit is directly coupled to the second output terminal of the switch control circuit.

The embodiment of the present invention also provides a switch control circuit, a gate of a first transistor switch is coupled to an input terminal of a first voltage providing line, a source thereof is coupled to a first input terminal of the switch control circuit, and a drain thereof is coupled to a third output terminal of the switch control circuit;

a gate of a second transistor switch is coupled to the input terminal of the first voltage providing line, a source thereof is coupled to a second input terminal of the switch control circuit, and a drain thereof is coupled to a first output terminal of the switch control circuit;

a gate of a third transistor switch is coupled to an input terminal of a second voltage providing line, a source thereof is coupled to the first input terminal of the switch control circuit, and a drain thereof is coupled to the first output terminal of the switch control circuit;

a gate of a fourth transistor switch is coupled to the input terminal of the second voltage providing line, a source thereof is coupled to the second input terminal of the switch control circuit, and a drain thereof is coupled to the third output terminal of the switch control circuit; and the third input terminal of the switch control circuit is directly coupled to the second output terminal of the switch control circuit.

The embodiment of the present invention also provides a shift register unit, comprising seven transistor switches, a capacitor and a output terminal;

a gate of the first transistor switch is coupled to an output terminal of a preceding stage of shift register unit, a source thereof is coupled to a first voltage providing line, and a drain thereof is coupled to the gate of the seventh transistor switch;

a gate of the second transistor switch is coupled to an output terminal of the next stage of shift register unit, a source thereof is coupled to a second voltage providing line, and a drain thereof is coupled to the gate of the seventh transistor switch;

a gate and a source of the third transistor switch are coupled to a reset terminal of the shift register unit, and a drain thereof is coupled to the gate of the sixth transistor switch;

a gate of the fourth transistor switch is coupled to the gate of the seventh transistor switch, a source thereof is coupled to a ground voltage providing line, and a drain thereof is coupled to the gate of the sixth transistor switch;

a gate of the fifth transistor switch is coupled to the gate of the six transistor switch, a source thereof is coupled to a ground voltage providing line, and a drain thereof is coupled to the gate of the seventh transistor switch;

the source of the sixth transistor switch is coupled to the ground voltage providing line, and the drain thereof is coupled to the output terminal of the shift register unit;

the source of the seventh transistor switch is coupled to the clock input terminal of the shift register unit, and the drain thereof is coupled to the output terminal of the shift register unit;

one terminal of the capacitor C is coupled to the gate of the seventh transistor, and the other terminal thereof is coupled to the output terminal OUT of the shift register unit.

The above technical solutions of the present invention have the following technical effects:

In the above technical solutions, a first switch control circuit is configured to be respectively coupled to each of the multiple stages of shift register units; a second switch control circuit is configured to be respectively coupled to each of the multiple stages of shift register units; the first switch control circuit control each of the multiple stages of shift register units to turn on in a forward sequence under the forward signal; and the second switch control circuit control each of the multiple stages of shift register units to turn on in a backward sequence under the backward signal. As a result, the input terminal of each of the multiple stages of shift register units turns out to be two input terminals, and is capable of receiving the output from the shift register unit in the preceding row and receiving the output from the shift register unit in the next row, so that the bi-directional driving control of the gate lines can be implemented.

DETAILED DESCRIPTION OF THE PREFERRED EMBODIMENTS

In the following, the explanation will be made in details in associated with figures and specific embodiments to further clarify the technical problems to be solved by the present invention, the technical solutions and the advantages.

Figure 2:
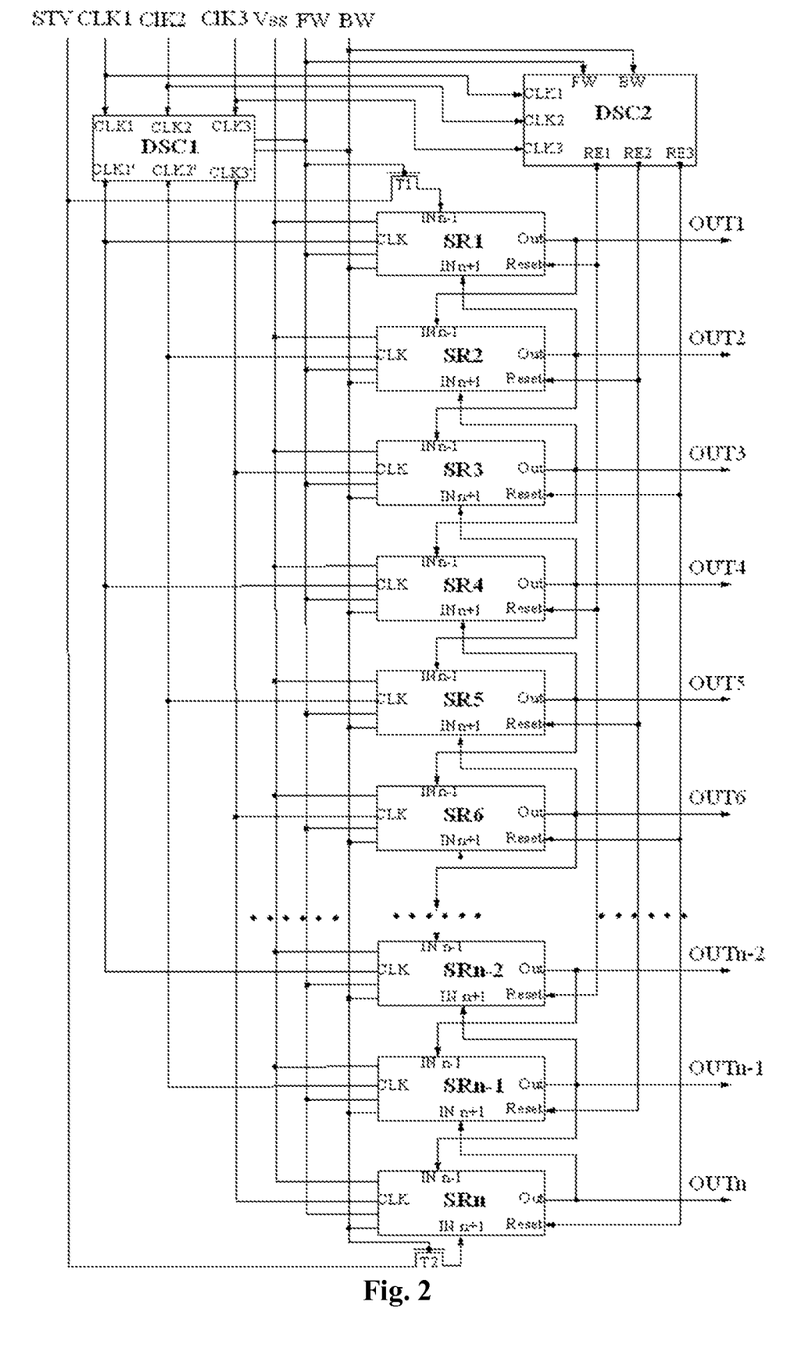
FIG. 2 is a schematic diagram of a gate driving circuit of a LCD device according to the present invention.

As illustrated in FIG. 2, an embodiment of the present invention provides a gate driving circuit of a display device, which comprises:

multiple stages of shift register units (SR1~SRn), being configured to be coupled sequentially, and each of the multiple stages of shift register units being coupled to a row of gate line;

a first switch control circuit DSC1, being configured to be respectively coupled to each of the multiple stages of shift register units, input a pull-up signal to each of the multiple stages of shift register units under the control of a forward signal, and control each of the multiple stages of shift register units to turn on in a forward sequence;

a second switch control circuit DSC2, being configured to be respectively coupled to each of the multiple stages of shift register units, input a reset signal to each of the multiple stages of shift register units under the control of a backward signal, and control each of the multiple stages of shift register units to turn on in a backward sequence;

a first TFT T1, being configured to input a start signal to the first stage of shift register unit among the multiple stages of shift register units under the control of the forward signal;

a second TFT T2, being configured to input a start signal to the last stage of shift register unit among the multiple stages of shift register units under the control of the backward signal.

Here, the gate driving circuit may further comprise: a first clock providing line CLK1, a second clock providing line CLK2 and a third clock providing line CLK3.

A first input terminal, a second input terminal and a third input terminal of the first switch control circuit DSC1 may be coupled to the first clock providing line CLK1, the second clock providing line CLK2 and the third clock providing line CLK3 respectively.

A first input terminal, a second input terminal and a third input terminal of the second switch control circuit DSC2 may be coupled to the first clock providing line CLK1, the second clock providing line CLK2 and the third clock providing line CLK3 respectively.

The gate driving circuit may further comprise: a first voltage providing line FW and a second voltage providing line BW.

A fourth input terminal and a fifth input terminal of the first switch control circuit DSC1 may be coupled to the first voltage providing line FW and the second voltage providing line BW respectively.

A fourth input terminal and a fifth input terminal of the second switch control circuit DSC2 may be coupled to the first voltage providing line FW and the second voltage providing line BW respectively.

The gate driving circuit may further comprise: a turn on voltage providing line STV.

The gate of the first TFT switch T1 may be coupled to the first voltage providing line FW, the drain thereof may be coupled to an input terminal of the first stage of shift register unit SR1, and the source thereof may be coupled to the turn on voltage providing line STV.

The gate of the second TFT switch T2 may be coupled to the second voltage providing line BW, the drain thereof may be coupled to an input terminal of the N-th stage of shift register unit SRn, and the drain thereof may be coupled to the turn on voltage providing line STV; wherein, the first stage of shift register unit SR1 is the first stage of shift register unit among the multiple stages of shift register units in a forward sequence, and the N-th stage of shift register unit is the last stage of shift register unit among the multiple stages of shift register units in the forward sequence, where N is a positive integer and greater than 1.

Furthermore, each of the first switch control circuit DSC1 and the second switch control circuit DSC2 may have three output terminals; a clock input terminal CLK of the multiple stages of shift register units may be sequentially coupled to a first output terminal CLK1', a second output terminal CLK2' and a third output terminal CLK3' of the first switch control circuit DSC1 in a forward sequence;

The reset terminal RESET of the multiple stages of shift register units may be sequentially coupled to a first output terminal RE1, a second output terminal RE2 and a third output terminal RE3 of the second switch control circuit DSC2.

The input terminal of each of the multiple stages of shift register units may be also coupled to the first voltage providing line FW and the second voltage providing line BW.

Here, DSC1 serves as the control switch for the forward scanning direction, and DSC2 serves as the control switch for the backward scanning direction; wherein, the forward scanning control voltage FW and the backward scanning control voltage BW are provided with a high level and a low level respectively, and have opposite phases according to the scanning directions. Each of the first TFT T1 and the second TFT T2 controls its state of whether being turned on based on the voltage magnitude of the FW and BW, so that controls the input of the turn on voltage providing line STV.

Figure 3:
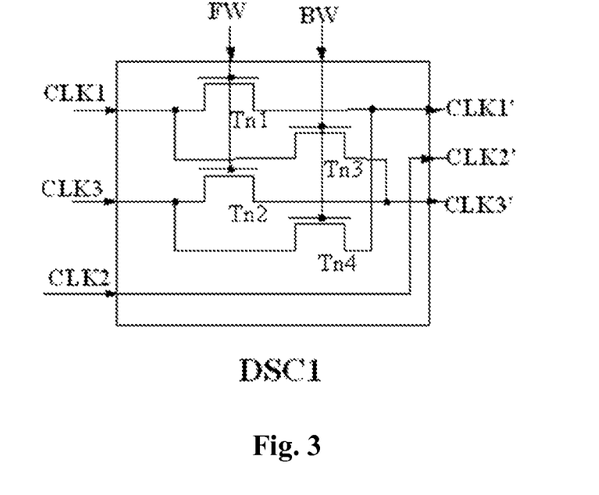
FIG. 3 is a circuit schematic diagram of a scanning direction control switch (DSC1) as illustrated in FIG. 2.

As illustrated in FIG. 3, the first switch control circuit DSC1 may comprise four transistor switches Tn1, Tn2, Tn3 and Tn4; wherein, each of four transistor switches Tn1, Tn2, Tn3 and Tn4 is the TFT.

The gate of the first transistor switch Tn1 may be coupled to its fourth input terminal (i.e., the terminal coupled to the first voltage providing line FW), the source thereof may be coupled to its first input terminal (i.e., the terminal coupled to the first clock providing line CLK1), and the drain thereof may be coupled to its first output terminal CLK1'.

The gate of the second transistor switch Tn2 may be coupled to its fourth input terminal (i.e., the terminal coupled to the first voltage providing line FW), the source thereof may be coupled to its third input terminal (i.e., the terminal coupled to the third clock providing line CLK3), and the drain thereof may be coupled to its third output terminal CLK3'.

The gate of the third transistor switch Tn3 may be coupled to its fifth input terminal (i.e., the terminal coupled to the second voltage providing line BW), the source thereof may be coupled to its first input terminal (i.e., the terminal coupled to the first clock providing line CLK1), and the drain thereof may be coupled to its third output terminal CLK3'.

The gate of the fourth transistor switch Tn4 may be coupled to its fifth input terminal (i.e., the terminal coupled to the second voltage providing line BW), the source thereof may be coupled to its third input terminal (i.e., the terminal coupled to the third clock providing line CLK3), and the drain thereof may be coupled to its first output terminal CLK1'.

The second input terminal (i.e., the terminal coupled to the second clock providing line CLK2) of the first switch control circuit is directly coupled to its second output terminal CLK2'.

Figure 7:
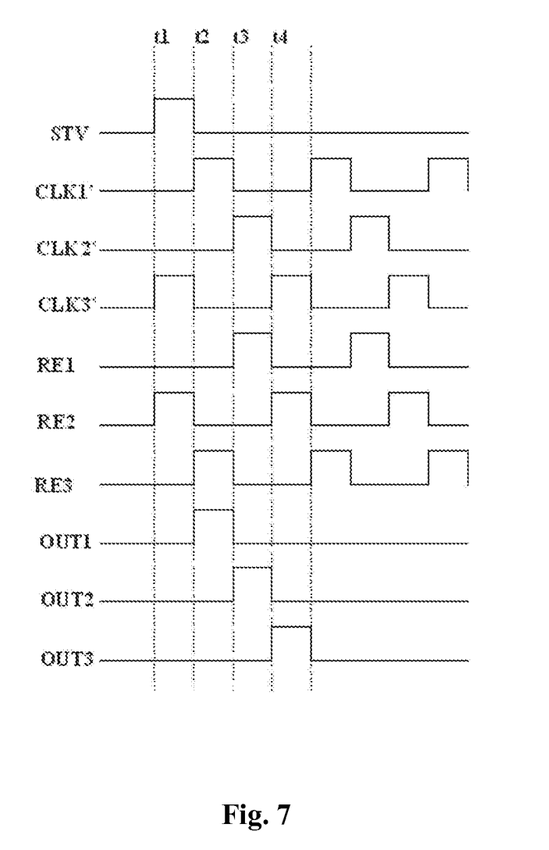
FIG. 7 is a time sequence diagram of forward scanning of a gate driving circuit according to an embodiment of the present invention.

The output terminals CLK1', CLK2', CLK3' of the first switch control circuit DSC1 are sequentially coupled to the clock input terminal CLK of each of the multiple stages of shift register units. When scanning forwardly (FW=1, BW=0), Tn1 and Tn2 will turn on, and the output terminals CLK1', CLK2', CLK3' will output the clock signals of CLK1, CLK2 and CLK3 respectively. When scanning backwardly (FW=0, BW=1), Tn3 and Tn4 will turn on, and the output terminal CLK1', CLK2' and CLK3' will output the clock signals of CLK3, CLK2 and CLK1 respectively. As illustrated in FIG. 7, DSC1 causes the output time sequences of the CLK1', CLK2' and CLK3' to have opposite time sequences by the forward scanning and the backward scanning.

Figure 4:
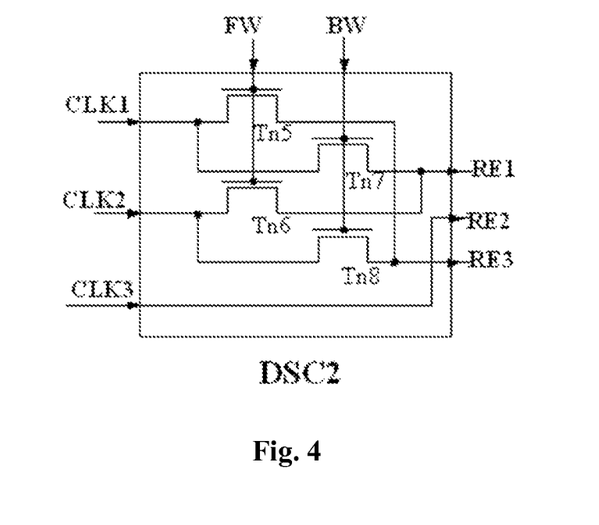
FIG. 4 is a circuit schematic diagram of a scanning direction control switch (DSC2) as illustrated in FIG. 2.

Furthermore, as illustrated in FIG. 4, the second switch control circuit DSC2 may comprise: four transistor switch Tn5, Tn6, Tn7 and Tn8; wherein, each of the four transistor switch Tn5, Tn6, Tn7 and Tn8 is also TFT.

The gate of the first transistor switch Tn5 is coupled to its fourth input terminal (i.e., the terminal coupled to the first voltage providing line FW), the source thereof may be coupled to its first input terminal (i.e., the terminal coupled to the first clock providing line CLK1), and the drain thereof may be coupled to its third output terminal RE3.

The gate of the second transistor switch Tn6 is coupled to its fourth input terminal (i.e., the terminal coupled to the first voltage providing line FW), the source thereof may be coupled to its second input terminal (i.e., the terminal coupled to the second clock providing line CLK2), and the drain thereof may be coupled to its first output terminal RE1.

The gate of the third transistor switch Tn7 may be coupled to its fifth input terminal (i.e., the terminal coupled to the second voltage providing line BW), the source thereof may be coupled to its first input terminal (i.e., the terminal coupled to the first clock providing line CLK1), and the drain thereof may be coupled to its first output terminal RE1.

The gate of the fourth transistor switch Tn8 may be coupled to its fifth input terminal (i.e., the terminal coupled to the second voltage providing line BW), the source thereof may be coupled to its second input terminal (i.e., the terminal coupled to the second clock providing line CLK2), and the drain thereof may be coupled to its third output terminal RE3.

The third input terminal (i.e., the terminal coupled to the third clock providing line CLK3) of the second switch control circuit may be directly coupled to its second output terminal RE2.

Figure 8:
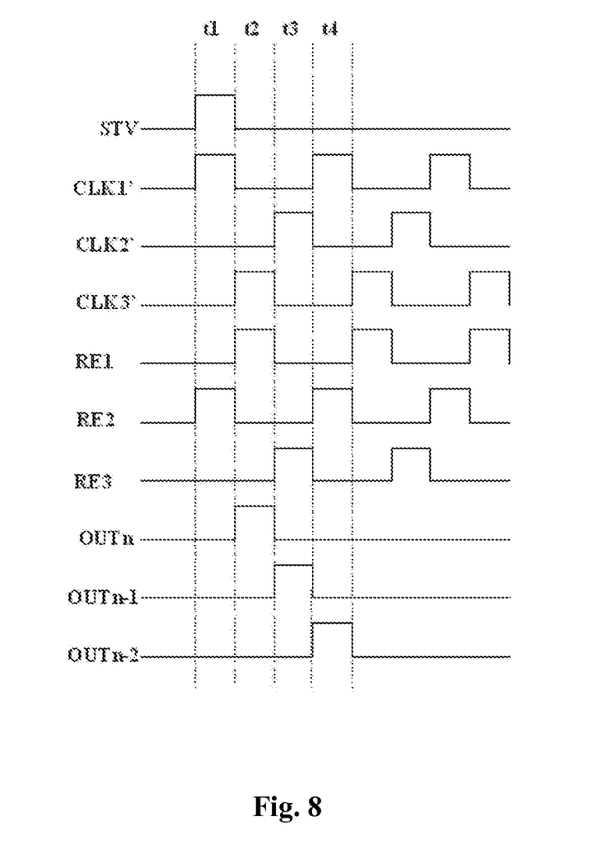
FIG. 8 is a time sequence diagram of backward scanning of a gate driving circuit according to an embodiment of the present invention.

Specifically, the output terminals RE1, RE2, and RE3 of DSC2 may be sequentially coupled to the reset terminal RESET of each of the multiple stages of shift register units. When scanning forwardly (FW=1, BW=0), Tn5 and Tn6 will turn on, and the output terminals RE1, RE2 and RE3 will output the clock signals of CLK2, CLK3 and CLK1 respectively. When scanning backwardly (FW=0, BW=1), Tn7 and Tn8 will turn on, and the output terminals RE1, RE2 and RE3 will output the clock signals of CLK1, CLK3 and CLK2 respectively. As illustrated in FIG. 8, DSC2 causes the output time sequences of the RE1, RE2 and RE3 to have opposite time sequences by the forward scanning and the backward scanning.

Figure 5:
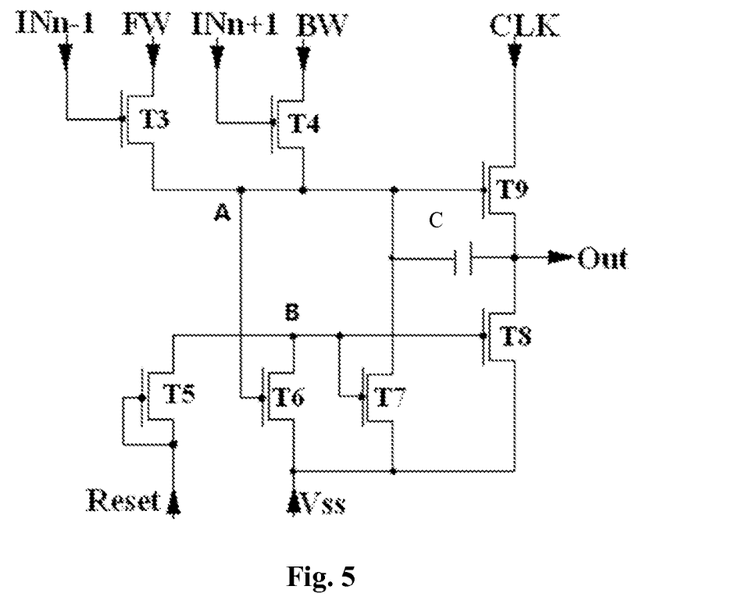
FIG. 5 is a circuit structure schematic diagram of a shift register unit as illustrated in FIG. 2.

As illustrated in FIG. 5, the shift register unit may comprise seven transistor switches T3~T9.

The gate INn−1 of the first transistor switch T3 is used to be coupled to the output terminal OUT of the preceding stage of shift register unit, the source thereof (i.e., the terminal coupled to the first voltage providing line FW) may be coupled to the first voltage providing line FW, and the drain thereof may be coupled to the gate of the seventh transistor switch T9.

The gate INn+1 of the second transistor switch T4 is used to be coupled to the output terminal OUT of the next stage of shift register unit, the source thereof (i.e., the terminal coupled to the second voltage providing line BW) may be coupled to the second voltage providing line BW, and the drain may be coupled to the gate of the seventh transistor switch T9.

Both the gate and the source of the third transistor switch T5 may be coupled to its reset terminal Reset, and the drain thereof may be coupled to the gate of the sixth transistor switch T8.

The gate of the fourth transistor switch T6 may be coupled to the drain of T3, the source thereof may be coupled to the ground voltage providing line Vss, and the drain thereof may be coupled to the gate of the sixth transistor switch T8.

The gate of the fifth transistor switch T7 may be coupled to the gate of the sixth transistor switch T8, the source thereof may be coupled to the ground voltage providing line Vss, and the drain thereof may be coupled to the gate of the seventh transistor switch T8.

The source of the sixth transistor switch T8 may be coupled to the ground voltage providing line Vss, and the drain thereof may be coupled to the output terminal OUT of the shift register unit.

The source of the seventh transistor switch T9 may be coupled to the clock input terminal CLK of the shift register unit, and the drain thereof may be coupled to the output terminal OUT of the shift register unit.

A terminal of the capacitor C may be coupled to the gate of the seventh transistor, and the other terminal thereof may be coupled to the output terminal OUT.

Here, the gate INn−1 of the first transistor switch T3 of the first stage of shift register units SR1 is coupled to the drain of the first TFT switch T1, and the gate IN+1 of the second transistor switch T4 is coupled to the output terminal OUT of the next shift register unit SR2.

The gate INn+1 of the second transistor switch T4 of the N-th stage of shift register unit SRn is coupled to the drain of the second TFT switch T2, and the gate INn−1 of the first transistor switch T3 is coupled to the output terminal OUT of the preceding stage of shift register unit SRn−1.

Here, the transistors T3 and T4 of the shift register unit function as an input circuit, T5, T7, and T8 function as a reset circuit, T9 functions as pulling up, and T6 functions as pulling down.

The CLK terminal of the shift register units SR1~SRn is sequentially coupled to the three output terminals CLK1', CLK2' and CLK3' of DSC1, and the terminal RESET is sequentially coupled to the three output terminals RE1, RE2 and RE3 of DSC2.

Furthermore, when being coupled, the terminals CLK1', CLK2' and CLK3' correspond to the terminals RE1, RE2 and RE3. In other words, when the terminal CLK of the shift register unit is coupled to the terminal CLK1', its terminal RESET is coupled to the terminal RE1; when the terminal CLK of the shift register unit is coupled to the terminal CLK2', its terminal RESET is coupled to the terminal RE2; and when the terminal CLK of the shift register unit is coupled to the terminal CLK3', its terminal RESET is coupled to the terminal RE3.

Figure 6:
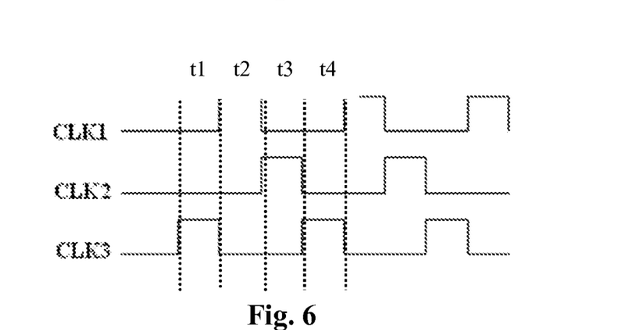
FIG. 6 is a time sequence diagram of three CLK clock signals as illustrated in FIG. 2.

As illustrated in FIG. 6, in the above circuit, the pulse time sequence of the output voltage of the first clock providing line CLK1 may be as follow: the low level during time t1, the high level during time t2, the low level during time t3, the low level during time t4, and such time sequence of t1-t4 is sequentially repeated.

The pulse time sequence of the output voltage of the second clock providing line CLK2 may be as follow: the low level during time t1, the low level during time t2, the high level during time t3, the low level during time t4, and such time sequence of t1-t4 is sequentially repeated.

The pulse time sequence of the output voltage of the third clock providing line CLK3 may be as follow: the high level during time t1, the low level during time t2, the low level during time t3, the high level during time t4, and such time sequence of t1-t4 is sequentially repeated.

As illustrated in FIGS. 7 and 8, the voltage pulse time sequence of the turn on voltage providing line STV may be as follow: high level during time t1 and low level during other time; by associating the pulse time sequences of CLK1, CLK2 and CLK3, the first output voltage signal of the first switch control circuit DSC1 may be: the output voltage signals of the first, second and third output terminals of the first switch control circuit as shown by the CLK1', CLK2' and CLK3' in FIGS. 7 and 8.

The second output voltage signal may be: the output voltage signals of the first, second and third output terminals of the second switch control circuit as shown by the RE1, RE2 and RE3 in FIGS. 7 and 8.

The specific operation time sequence of the whole circuit is shown in FIGS. 7 and 8:

When forward scanning is conducted:

The FW and BW are provided with the high level and the low level (FW=1, BW=0) respectively.

The three output terminals CLK1', CLK2' and CLK3' of DSC1 output the clock signals of CLK1, CLK2 and CLK3 respectively.

The three output terminals RE1, RE2 and RE3 of DSC2 output the clock signals of CLK2, CLK3 and CLK1 respectively.

During t1, the turn on pulse STV=1 remains at the high level, and T1 turns on and T2 turns off because FW=1 and BW=0. Therefore, STV signal is inputted into the terminal INn−1 of the shift register unit (SR1), so that its transistor T3 (as shown in FIG. 5) turns on, and the high level of FW is inputted into the point A, so that the point A remains at the high level during t1. Since the transistor T6 will turns on when the point A is at the high level, the point B remains at the low level of Vss.

During t2, STV turns into the low level, and CLK1' turns into the high level, and is outputted to the terminal CLK of the shift register unit SR1. By bootstrap effect, the level of the point A raises again, and the transistor T9 turns on, so that the high level of CLK1' is outputted to the terminal OUT1, and is further outputted to the gate line of the first row.

During t3, CLK1' turns into the low level from the high level, and OUT1 also turns into the low level. RE1 turns into the high level, and is outputted to the terminal RESET of the shift register unit SR1, so that T5 turns on, and the point B turns into the high level, which further causes that T7 and T8 turn on, which further causes that the level of the point A and the level of point OUT remain at the low level of Vss. Therefore, the gate line of the first row also remains at the low level of Vss.

In the following, the operation of the second stage shift register unit SR2 will be explained.

Since the signal of OUT1 outputted by the shift register unit SR1 during t2 is also inputted into the terminal INn−1 of the shift register unit SR2, the transistor T3 of the shift register unit SR2 turns on, and operates in a same manner as the shift register unit SR1 described above.

During t3, CLK2' remains at the high level, and is outputted to the terminal CLK of the shift register unit SR2. Being same as the operation of the shift register unit SR1, because of the bootstrap effect of the capacitor C, the high level of CLK2' is outputted to the terminal OUT2; and is further outputted to the gate line of the second row.

During t4, CLK2' turns into the low level from the high level, and OUT2 also turns into the low level. RE2 turns into the high level, and is outputted to the terminal RESET of the shift register unit SR2, and being same as the operation of the shift register unit SR1, the high level of the terminal RESET causes that the level of the point A and the level of the point OUT remain at the low level of Vss. Therefore, the gate line of the second row also remains at the low level of Vss.

The above operations are sequentially implemented, until reaching the last stage of shift register unit SRn.

When backward scanning is conducted:

The FW and BW are provided with the low level and the high level (FW=0, BW=1) respectively.

The three output terminals CLK1', CLK2' and CLK3' of DSC1 output the clock signals of CLK3, CLK2 and CLK1 respectively.

The three output terminals RE1, RE2 and RE3 of DSC2 output the clock signals of CLK1, CLK3 and CLK2 respectively.

During t1, the turn on pulse STV=1 remains at the high level, and T2 turns on and T1 turns off because FW=0 and BW=1. Therefore, STV signal is inputted into the terminal INn+1 of the shift register unit (SRn), so that its transistor T4 turns on, and the high level of BW is inputted into the point A, so that the point A remains at the high level during t1; since the transistor T6 will turns on when the point A is at the high level, the point B remains at the low level of Vss.

During t2, STV turns into the low level, and CLK3' turns into the high level, and is outputted to the terminal CLK of the shift register unit SRn. By bootstrap effect of the capacitor C, the level of the point A raises again, and the transistor T9 turns on, so that the high level of CLK3' is outputted to the terminal OUTn, and is further outputted to the gate line of the n-th row (last row).

During t3, CLK3' turns into the low level from the high level, and OUTn also turns into the low level. RE3 turns into the high level, and is outputted to the terminal RESET of the shift register unit SRn, so that T5 turns on, and the point B turns into the high level, which further causes that T7 and T8 turn on, which further causes that the level of the point A and the level of point Out remain at the low level of Vss. Therefore, the gate line of the n-th row also remains at the low level of Vss.

In the following, the operation of the N−1 stage of shift register unit SRn−1 will be explained.

Since the signal of OUTn outputted by the shift register unit SRn during t2 is also inputted into the terminal INn+1 of the shift register unit SRn−1, the transistor T4 of the shift register unit SRn−1 turns on, and operates in a same manner as the shift register unit SRn described above.

During t3, CLK2' remains at the high level, and is outputted to the terminal CLK of the shift register unit SRn−1. Being same as the operation of the shift register unit SRn, because of the bootstrap effect of the capacitor C, the high level of CLK2' is outputted to the terminal OUTn−1, and is further outputted to the gate line of the n−1-th row.

During t4, CLK2' turns into the low level from the high level, and OUTn−1 also turns into the low level. RE2 turns into the high level, and is outputted to the terminal RESET of the shift register unit SRn−1, and being same as the operation of the shift register unit SR1, the high level of the terminal RESET causes that the level of the point A and the level of the point OUT remain at the low level of Vss; therefore, the gate line of the n−1-th row also remains at the low level of the Vss.

The above operations are sequentially implemented, until reaching the first stage of shift register unit SR1.

According to the above described bi-directional scanning control method according to the embodiments of the present invention, only two scanning direction control switch (DSC1 and DSC2) are required to be additionally provided on the PCB board by such bidirectional shift register comparing with the conventional uni-directional shift register unit (as illustrated in FIG. 1). Furthermore, the INPUT terminal (the conventional uni-directional shift register unit may only receive the input from a preceding row) on each shift register unit is changed into two INPUT terminals (the terminal INn−1 and the terminal INn+1, which may receive both the input from a preceding row and the input from a next row). The bi-directional scanning control is implemented by two scanning directional control switches (DSC1 and SDC2).

The embodiment of the present invention also provides a switch control circuit, comprising: four transistor switches, two voltage providing line input terminals and three output terminals.

When the signal from the input terminal of the first voltage providing line is at a high level and the signal from the input terminal of the second voltage providing line is in a low level, the first transistor and the second transistor turn on, and the first output terminal, the second output terminal and the third output terminal output the signals from the first input terminal, the second input terminal and the third input terminal respectively.

When the signal from the input terminal of the first voltage providing line is in a low level and the signal from the input terminal of the second voltage providing line is at a high level, the third transistor and the fourth transistor turn on, and the first output terminal, the second output terminal and the third output terminal output the signals from the first input terminal, the second input terminal and the third input terminal respectively.

Here, as illustrated in FIG. 3, the gate of the first transistor switch Tn1 may be coupled to the input terminal FW of the first voltage providing line, the source thereof may be coupled to the first input terminal CLK1, and the drain thereof may be coupled to the first output terminal CLK1'; the gate of the second transistor switch Tn2 may be coupled to the input terminal FW of the first voltage providing line, the source thereof may be coupled to the third input terminal CLK3, and the drain thereof may be coupled to the third output terminal CLK3'; the gate of the third transistor switch Tn3 may be coupled to the input terminal BW of the second voltage providing line, the source thereof may be coupled to the first input terminal CLK1, and the drain thereof may be coupled to the third output terminal CLK3'; the gate of the fourth transistor switch Tn4 may be coupled to the input terminal BW of the second voltage providing line, the source thereof may be coupled to the third input terminal CLK3, and the drain thereof may be coupled to the first output terminal CLK1'; the second input terminal CLK2 may be directly coupled to the second output terminal CLK2'.

As illustrated in FIG. 4, the gate of the first transistor switch Tn5 may be coupled to the input terminal FW of the first voltage providing line, the source thereof may be coupled to the first input terminal CLK1, and the drain thereof may be coupled to the third output terminal RE3; the gate of the second transistor switch Tn6 may be coupled to the input terminal FW of the first voltage providing line, the source thereof may be coupled to the second input terminal CLK2, and the drain thereof may be coupled to the first output terminal RE1; the gate of the third transistor switch Tn7 may be coupled to the input terminal BW of the second voltage providing line, the source thereof may be coupled to the first input terminal CLK1, and the drain thereof may be coupled to the first output terminal RE1.

The gate of the fourth transistor switch Tn8 may be coupled to the input terminal BW of the second voltage providing line, the source thereof may be coupled to the second input terminal CLK2, and the drain thereof may be coupled to the third output terminal RE3; the third input terminal CLK3 may be directly coupled to the second output terminal RE2.

The embodiment of the present invention also provides a shift register unit, comprising: seven transistor switches, a capacitor and a output terminal.

The gate of the first transistor switch is used to be coupled to the output terminal of the preceding stage of shift register unit, the source thereof may be coupled to the first voltage providing line, and the drain thereof may be coupled to the gate of the seventh transistor switch.

The gate of the second transistor switch may be coupled to the output terminal of the next stage of shift register unit, the source thereof may be coupled to the second voltage providing line, and the drain thereof may be coupled to the gate of the seventh transistor switch.

Both the gate and the source of the third transistor switch may be coupled to its reset terminal, and the drain thereof may be coupled to the gate of the sixth transistor switch.

The gate of the fourth transistor switch may be coupled to the drain of the first transistor switch, the source thereof may be coupled to the ground voltage providing line, and the drain thereof may be coupled to the gate of the sixth transistor switch.

The gate of the fifth transistor switch may be coupled to the gate of the sixth transistor switch, the source thereof may be coupled to the ground voltage providing line, and the drain thereof may be coupled to the gate of the seventh transistor switch.

the source of the sixth transistor switch may be coupled to the ground voltage providing line, and the drain thereof may be coupled to the output terminal of the shift register unit;

the source of the seventh transistor switch may be coupled to the clock input terminal CLK of the shift register unit, and the drain thereof may be coupled to the output terminal of the shift register unit.

One terminal of the capacitor may be coupled to the drain of the fifth transistor switch, and the other terminal thereof may be coupled to the output terminal.

The above descriptions are only preferred embodiments of the present invention. It should be noted that, for those ordinary skilled in the art, many modifications and polishes may be made without departure from the principles of the present invention, and these modification and polishes should also be deemed to be fallen into the protection scope of the present invention.

What is claimed is:

1. A gate driving circuit of a display device, comprising:
multiple stages of shift register units, being configured to be sequentially coupled, wherein each of the multiple stages of shift register units is coupled to a row of gate line;
a first switch control circuit, being configured to be respectively coupled to each of the multiple stages of shift register units, input a pull-up signal to each of the multiple stages of shift register units under the control of a forward signal, and control each of the multiple stages of shift register units to turn on in a forward sequence;

a second switch control circuit, being configured to be respectively coupled to each of the multiple stages of shift register units, input a reset signal to each of the multiple stages of shift register units under the control of a backward signal, and control each of the multiple stages of shift register units to turn on in a backward sequence;

a first thin film transistor (TFT), being configured to input a start signal to a first stage of shift register unit among the multiple stages of shift register units under the control of the forward signal; and a second TFT, being configured to input the start signal to the last stage of shift register unit among the multiple stages of shift register units under the control of the backward signal, wherein the first TFT and the second TFT are external to each of the multiple stages of shift register units.

2. The gate driving circuit of the display device according to claim 1, wherein a first input terminal, a second input terminal and a third input terminal of the first switch control circuit are coupled to a first clock providing line, a second clock providing line and a third clock providing line respectively; and a first input terminal, a second input terminal and a third input terminal of the second switch control circuit are coupled to the first clock providing line, the second clock providing line and the third clock providing line respectively.

3. The gate driving circuit of the display device according to claim 2, wherein a fourth input terminal and a fifth input terminal of the first switch control circuit are coupled to a first voltage providing line and a second voltage providing line respectively; and a fourth input terminal and a fifth input terminal of the second switch control circuit are coupled to the first voltage providing line and the second voltage providing line respectively.

4. The gate driving circuit of the display device according to claim 3, wherein a gate of the first TFT is coupled to the first voltage providing line, a drain of the first TFT is coupled to an input terminal of the first stage of shift register unit, and a source of the first TFT is coupled to a turn on voltage providing line; and a gate of the second TFT is coupled to the second voltage providing line, a drain of the second TFT is coupled to an input terminal of the last stage of shift register unit, and a source of the second TFT is coupled to the turn on voltage providing line.

5. The gate driving circuit of the display device according to claim 1, wherein a terminal of each of the multiple stages of shift register units is further coupled to a ground voltage providing line.

6. The gate driving circuit of the display device according to claim 5, wherein each of the first switch control circuit and the second switch control circuit has three output terminals; clock input terminals of the multiple stages of shift register units are sequentially coupled to a first output terminal, a second output terminal and a third output terminal of the first switch control circuit;

reset terminals of the multiple stages of shift register units are sequentially coupled to a first output terminal, a second output terminal and a third output terminal of the second switch control circuit; and the input terminals of each of the multiple stages of shift register units are also coupled to both a first voltage providing line and a second voltage providing line.

7. The gate driving circuit of the display device according to claim 6, wherein the first switch control circuit comprises a first transistor switch, a second transistor switch, a third transistor switch and a fourth transistor switch; wherein a gate of the first transistor switch of the first switch control circuit is coupled to a fourth input terminal of the first switch control circuit, a source of the first switch control circuit is coupled to a first input terminal of the first switch control circuit, and a drain of the first switch control circuit is coupled to the first output terminal of the first switch control circuit;

a gate of the second transistor switch of the first switch control circuit is coupled to the fourth input terminal of the first switch control circuit, the source of the first switch control circuit is coupled to a third input terminal of the first switch control circuit, and the drain of the first switch control circuit is coupled to the third output terminal of the first switch control circuit;

a gate of the third transistor switch of the first switch control circuit is coupled to a fifth input terminal of the first switch control circuit, the source of the first switch control circuit is coupled to the first input terminal of the first switch control circuit, and the drain of the first switch control circuit is coupled to the third output terminal of the first switch control circuit;

a gate of the fourth transistor switch of the first switch control circuit is coupled to a fifth input terminal of the first switch control circuit, the source of the first switch control circuit is coupled to the third input terminal of the first switch control circuit, and the drain of the first switch control circuit is coupled to the first output terminal of the first switch control circuit; and a second input terminal of the first switch control circuit is directly coupled to the second output terminal of the first switch control circuit.

8. The gate driving circuit of the display device according to claim 6, wherein the second switch control circuit comprises a fifth transistor switch, a sixth transistor switch, a seventh transistor switch and an eighth transistor switch; wherein a gate of the fifth transistor switch of the second switch control circuit is coupled to a fourth input terminal of the second switch control circuit, a source of the second switch control circuit is coupled to a first input terminal of the second switch control circuit, and a drain of the second switch control circuit is coupled to the third output terminal of the second switch control circuit;

a gate of the sixth transistor switch of the second switch control circuit is coupled to the fourth input terminal of the second switch control circuit, the source of the second switch control circuit is coupled to a second input terminal of the second switch control circuit, and the drain of the second switch control circuit is coupled to the first output terminal of the second switch control circuit;

a gate of the seventh transistor switch of the second switch control circuit is coupled to a fifth input terminal of the second switch control circuit, the source of the second switch control circuit is coupled to the first input terminal of the second switch control circuit, and the drain of the second switch control circuit is coupled to the first output terminal of the second switch control circuit;

a gate of the eighth transistor switch of the second switch control circuit is coupled to a fifth input terminal of the second switch control circuit, the source of the second switch control circuit is coupled to the second input terminal of the second switch control circuit, and the drain of the second switch control circuit is coupled to the third output terminal of the second switch control circuit; and a third input terminal of the second switch control circuit is directly coupled to the second output terminal of the second switch control circuit.

9. The gate driving circuit of the display device according to claim 8, wherein the shift register unit comprises seven transistor switches and a capacitor;

a gate of a first transistor switch of the shift register unit is coupled to the output terminal of preceding stage of the shift register unit, a source of the shift register unit is coupled to the first voltage providing line, and the drain of the shift register unit is coupled to the gate of the seventh transistor switch of the shift register unit;

a gate of a second transistor switch of the shift register unit is coupled to an output terminal of the next stage of shift register unit, the source of the shift register unit is coupled to the second voltage providing line, and the drain of the shift register unit is coupled to the gate of the seventh transistor switch of the shift register unit;

a gate and a source of a third transistor switch of the shift register unit are coupled to the reset terminal of the shift register unit, and a drain of the shift register unit is coupled to the gate of the sixth transistor switch of the shift register unit;

a gate of a fourth transistor switch of the shift register unit is coupled to the drain of the first transistor switch of the shift register unit, a source of the shift register unit is coupled to the ground voltage providing line, and a drain of the shift register unit is coupled to the gate of the sixth transistor switch of the shift register unit;

a gate of a fifth transistor switch of the shift register unit is coupled to the gate of the sixth transistor switch of the shift register unit, a source of the shift register unit being as a sixth input terminal of the shift register unit is coupled to the ground voltage providing line, and a drain of the shift register unit is coupled to the gate of the seventh transistor switch of the shift register unit;

a source of a sixth transistor switch of the shift register unit is coupled to the ground voltage providing line, and a drain of the shift register unit is coupled to the output terminal of the shift register unit;

a source of a seventh transistor switch of the shift register unit being as a seventh input terminal of the shift register unit is coupled to the clock input terminal of the shift register unit, and a drain of the shift register unit is coupled to the output terminal of the shift register unit;

one terminal of the capacitor is coupled to the gate of the seventh transistor switch of the shift register unit, and another terminal of the shift register unit is coupled to the output terminal of the shift register unit;

wherein the gate of the first transistor switch of the first stage of shift register unit is coupled to the drain of the first TFT, and the gate of the second transistor switch of the shift register unit is coupled to the output terminal of the next stage of shift register unit; and the gate of the second transistor switch of the last stage of shift register unit is coupled to the drain of the second TFT, and the gate of the first transistor switch of the shift register unit is coupled to the output terminal of the preceding stage of shift register unit.

10. The gate driving circuit of the display device according to claim 4, wherein when the signal of the first voltage providing line is at a high level and the signal of the second voltage providing line is at a low level, output terminals of the first switch control circuit and second switch control circuit output clock signals of the first clock providing line, the second clock providing line and the third clock providing line respectively, the clock signals being inputted into the multiple stages of shift register units to implement forward scanning of multiple rows of gate lines under the control of the first TFT and the second TFT; or when the signal of the first voltage providing line is at a low level and the signal of the second voltage providing line is at a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

11. The gate driving circuit of the display device according to claim 5, wherein when the signal of the first voltage providing line is a high level and the signal of the second voltage providing line is a low level, output terminals of the first switch control circuit and second switch control circuit output clock signals of a first clock providing line, a second clock providing line and a third clock providing line respectively, the clock signals being inputted into the multiple stages of shift register units to implement forward scanning of multiple rows of gate lines under the control of the first TFT and the second TFT; or when the signal of the first voltage providing line is a low level and the signal of the second voltage providing line is a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

12. The gate driving circuit of the display device according to claim 6, wherein when the signal of the first voltage providing line is a high level and the signal of the second voltage providing line is a low level, the output terminals of the first switch control circuit and second switch control circuit output clock signals of a first clock providing line, a second clock providing line and a third clock providing line respectively, the clock signals being inputted into the multiple stages of shift register units to implement forward scanning of multiple rows of gate lines under the control of the first TFT and the second TFT; or when the signal of the first voltage providing line is a low level and the signal of the second voltage providing line is a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

13. The gate driving circuit of the display device according to claim 7, wherein
when the signal of the first voltage providing line is at a high level and the signal of the second voltage providing line is at a low level, the output terminals of the first switch control circuit and second switch control circuit output clock signals of a first clock providing line, a second clock providing line and a third clock providing line respectively, the clock signals being inputted into the multiple stages of shift register units to implement forward scanning of multiple rows of gate lines under the control of the first TFT and the second TFT; or
when the signal of the first voltage providing line is at a low level and the signal of the second voltage providing line is at a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

14. The gate driving circuit of the display device according to claim 8, wherein
when the signal of the first voltage providing line is a high level and the signal of the second voltage providing line is a low level, the output terminals of the first switch control circuit and second switch control circuit output clock signals of a first clock providing line, a second clock providing line and a third clock providing line respectively, the clock signals being inputted into the multiple stages of shift register units to implement forward scanning of multiple rows of gate lines under the control of the first TFT and the second TFT; or
when the signal of the first voltage providing line is a low level and the signal of the second voltage providing line is a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

15. The gate driving circuit of the display device according to claim 9, wherein
when the signal of the first voltage providing line is a high level and the signal of the second voltage providing line is a low level, the output terminals of the first switch control circuit and second switch control circuit output clock signals of a first clock providing line, a second clock providing line and a third clock providing line respectively, the clock signals being inputted into the multiple stages of shift register units to implement forward scanning of multiple rows of gate lines under the control of the first TFT and the second TFT; or
when the signal of the first voltage providing line is a low level and the signal of the second voltage providing line is a high level, the output terminals of the first switch control circuit and the second switch control circuit output the clock signals of the first clock providing line, the second clock providing line and the third clock providing line respectively, the clock signals being inputted into the multiple stages of shift register units to implement backward scanning of multiple rows of gate lines under the control of the first TFT and the second TFT.

16. A switch control circuit, comprising a first transistor switch, a second transistor switch, a third transistor switch and a fourth transistor switch; wherein
a gate of the first transistor switch is coupled to an input terminal of a first voltage providing line, a source of the first transistor switch is coupled to a first input terminal of the switch control circuit, and a drain of the first transistor switch is coupled to a first output terminal of the switch control circuit;
a gate of the second transistor switch is coupled to the input terminal of the first voltage providing line, a source of the second transistor switch is coupled to a third input terminal of the switch control circuit, and a drain of the second transistor switch is coupled to a third output terminal of the switch control circuit;
a gate of the third transistor switch is coupled to an input terminal of a second voltage providing line, a source of the third transistor switch is coupled to the first input terminal of the switch control circuit, a drain of the third transistor switch is coupled to the third output terminal of the switch control circuit;
a gate of the fourth transistor switch is coupled to the input terminal of the second voltage providing line, a source of the fourth transistor switch is coupled to the third input terminal of the switch control circuit, and a drain of the fourth transistor switch is coupled to the first output terminal of the switch control circuit; and
a second input terminal of the switch control circuit is directly coupled to a second output terminal of the switch control circuit.

17. A switch control circuit, comprising a first transistor switch, a second transistor switch, a third transistor switch and a fourth transistor switch; wherein
a gate of the first transistor switch is coupled to an input terminal of a first voltage providing line, a source of the first transistor switch is coupled to a first input terminal of the switch control circuit, and a drain of the first transistor switch is coupled to a third output terminal of the switch control circuit;
a gate of the second transistor switch is coupled to the input terminal of the first voltage providing line, a source of the second transistor switch is coupled to a second input terminal of the switch control circuit, and a drain of the second transistor switch is coupled to a first output terminal of the switch control circuit;
a gate of the third transistor switch is coupled to an input terminal of a second voltage providing line, a source of the third transistor switch is coupled to the first input terminal of the switch control circuit, and a drain of the third transistor switch is coupled to the first output terminal of the switch control circuit;
a gate of the fourth transistor switch is coupled to the input terminal of the second voltage providing line, a source of the fourth transistor switch is coupled to the second input terminal of the switch control circuit, and a drain of the fourth transistor switch is coupled to the third output terminal of the switch control circuit; and
a third input terminal of the switch control circuit is directly coupled to a second output terminal of the switch control circuit.

18. A shift register unit, comprising a first transistor switch, a second transistor switch, a third transistor switch, a fourth transistor switch, a fifth transistor switch, a sixth transistor switch and a seventh transistor switch, a capacitor and an output terminal; wherein
a gate of the first transistor switch is coupled to an output terminal of a preceding stage of shift register unit, a source of the shift register unit is coupled to a first voltage providing line, and a drain thereof is coupled to the gate of the seventh transistor switch;

a gate of the second transistor switch is coupled to an output terminal of the next stage of shift register unit, a source of the shift register unit is coupled to a second voltage providing line, and a drain thereof is coupled to the gate of the seventh transistor switch;

a gate and a source of the third transistor switch are coupled to a reset terminal of the shift register unit, and a drain of the shift register unit is coupled to the gate of the sixth transistor switch;

a gate of the fourth transistor switch is coupled to the gate of the seventh transistor switch, a source of the shift register unit is coupled to a ground voltage providing line, and a drain of the shift register unit is coupled to the gate of the sixth transistor switch;

a gate of the fifth transistor switch is coupled to the gate of the six transistor switch, a source of the shift register unit is coupled to the ground voltage providing line, and a drain of the shift register unit is coupled to the gate of the seventh transistor switch;

the source of the sixth transistor switch is coupled to the ground voltage providing line, and a drain of the shift register unit is coupled to the output terminal of the shift register unit;

the source of the seventh transistor switch is coupled to a clock input terminal of the shift register unit, and a drain thereof is coupled to the output terminal of the shift register unit; and one terminal of the capacitor is coupled to the gate of the seventh transistor switch, and another terminal of the shift register unit is coupled to the output terminal of the shift register unit.

\* \* \* \* \*